US006144266A

United States Patent [19]

Heidemann et al.

[11] Patent Number: 6,144,266

[45] Date of Patent: Nov. 7, 2000

[54] TRANSITION FROM A MICROSTRIP LINE TO A WAVEGUIDE AND USE OF SUCH TRANSITION

[75] Inventors: Rolf Heidemann, Tamm; Bernhard Junginger, Leonberg, both of Germany

[73] Assignee: Alcatel, Paris, France

[21] Appl. No.: 09/249,440

[22] Filed: Feb. 12, 1999

[30] Foreign Application Priority Data

Feb. 13, 1998 [DE] Germany .......................... 198 05 911

[51] Int. Cl.[7] ........................................ H03H 5/00

[52] U.S. Cl. ........................................ 333/26; 343/859

[58] Field of Search ........................ 333/26; 343/859

[56] References Cited

U.S. PATENT DOCUMENTS 4,479,100 10/1984 Moghe et al. ...................... 333/246 X

FOREIGN PATENT DOCUMENTS 958396 8/1956 Germany .
2 260 166 6/1974 Germany .
196 14 286 C1 9/1997 Germany .
59-51604 3/1984 Japan ........................................ 333/26
2-280503 11/1990 Japan ........................................ 333/26
4-109702 4/1992 Japan ........................................ 333/26
794884 5/1958 United Kingdom .

OTHER PUBLICATIONS

Peter L. Sullivan et al, Analysis of an Aperture Coupled Microstrip Antenna, IEEE Transactions on Antennas an Propagation. vol. AP–34, No. 8, Aug. 1986, S. 977–984.

Patent Abstracts of Japan, JP 09246816 A dated Sep. 19, 1997.

*Primary Examiner*—Paul Gensler
*Attorney, Agent, or Firm*—Sughrue, Mion, Zinn, Macpeak & Seas, PLLC

[57] ABSTRACT

A transition between a microstrip line and waveguide is proposed, wherein the ground surface of the microstrip line has an aperture and the ground surface of the microstrip line forms at least part of a wall of the waveguide.

11 Claims, 4 Drawing Sheets

TRANSITION FROM A MICROSTRIP LINE TO A WAVEGUIDE AND USE OF SUCH TRANSITION

BACKGROUND OF THE INVENTION

This application is based on and claims the benefit of German Patent Application No. 198 05 911.6 filed Feb. 13, 1998, which is incorporated by reference herein The invention is based on a transition from a microstrip line to a waveguide as well as on the use of such a transition in accordance with the class of the independent claims.

DE 1 96 14 286 discloses a coupling arrangement for coupling a resonator to a connecting lead suitable, in particular, for use with very high frequencies. A flat dielectric substrate is thereby aligned with the substrate plane perpendicular to the wall surfaces of the resonator. The planar waveguides extending on the substrate, which are based on microstrip technology, are brought up to the substrate edge facing the wall surface. The waveguides are connected, for example, to an extremely high frequency circuit arrangement. The electric wave field of the waveguide forming between the two conductors of the waveguide couples directly onto the electric field of the resonator in the aperture openings. It is furthermore known from prior art to couple microstrip lines to antennas. The microstrip line is carried on a substrate and the energy is coupled into the radiating antenna via an aperture. The antenna is designed as a waveguide and is tuned by means of vapor deposited dielectric films. The energy is coupled into the antenna through the aperture milled into the base plate.

It is furthermore known to produce coaxial connections with the waveguide by means of coupling rods.

In all cases, tuning is the greatest problem in coupling microstrip lines to waveguides. Especially in the area of very high frequencies, the mechanical dimensions of the components are small and the adjustment by means of tuning screws required, for example, with the use of coupling rods, is costly. Tuning by means of fixed dielectric surfaces in the waveguide is also a costly process.

JP 09246816 (abstract) discloses a transition, which transmits the energy from the microstrip line to the waveguide by means of an aperture. The waveguide design is conventional.

SUMMARY OF THE INVENTION

The transition according to the invention with the characteristic features of the independent claim has the advantage, by contrast, that it is monolithic, i.e., that the ground surface of the microstrip line at least partially forms a wall of the waveguide. The metallic body is provided with a cutout and a cover. Such a design permits a stable, robust construction—even for mass-produced products.

The measures indicated in the dependent claims are advantageous further developments and improvements of the transition defined in the independent claim.

It is particularly advantageous if the metallic body is formed by the back cladding of the substrate plate of the microstrip line. This permits a, particularly simple and inexpensive design of the transition.

It is particularly advantageous to fashion an antenna to which energy from the microstrip line is coupled through an aperture that is arranged either perpendicularly or parallel to the propagation direction of the microwaves within the waveguide and thus to optimize adjustment.

The transition, according to the invention, makes it possible in a simple manner to provide means in the waveguide to effect the adjustment. Suitable arc, for example, spurs, grooves and similar geometric forms in the walls.

The adjustment may also be effected by influencing the microstrip line. Connectable conductor elements, e.g., tabs bonded to the microstrip line may be used to fine-tune the component.

Such a component has the advantage of being so robust that it can be used in a HybridFiber Radio (HFR) network for the transmission of high frequency signals.

BRIEF DESCRIPTION OF THE DRAWING

An exemplary embodiment of the invention is depicted in the drawing and is explained in detail in the description below.

DETAILED DESCRIPTION OF THE INVENTION

Figure 1A:
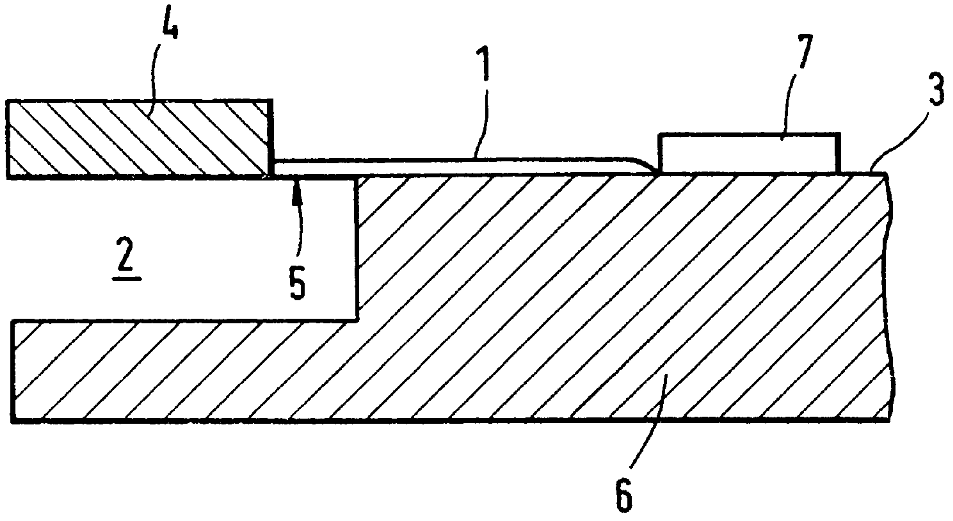
FIG. 1*a* is a cross section of the transition according to the invention.
Figure 1B:
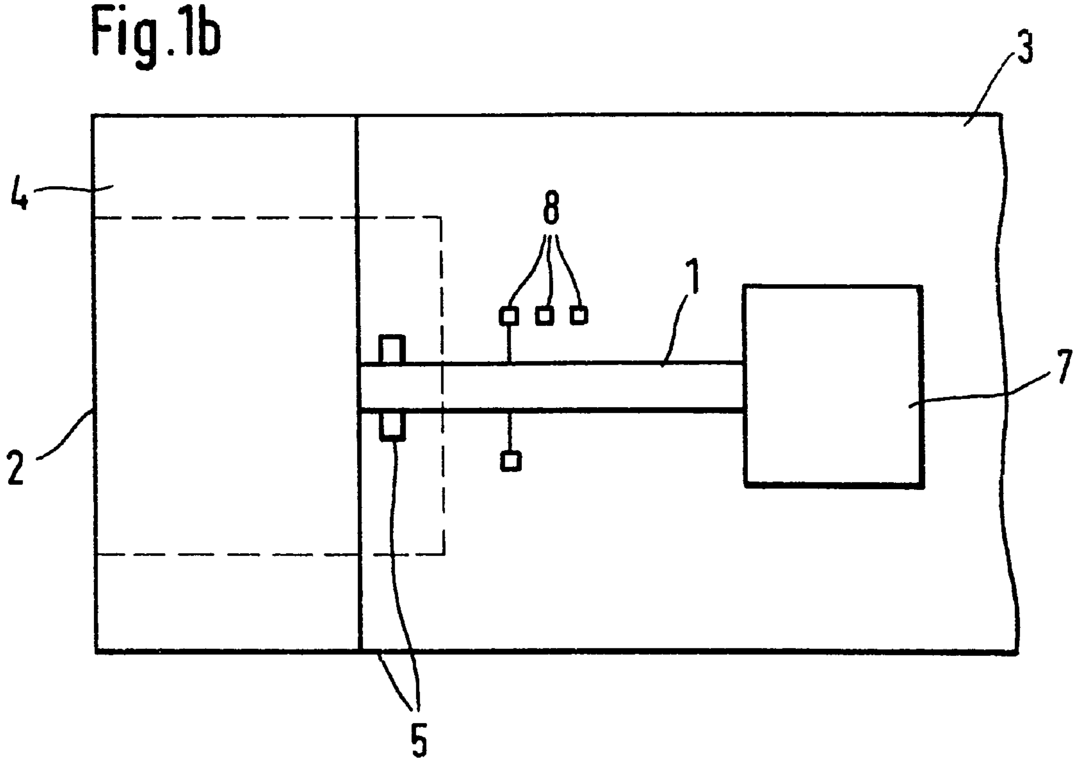
FIG. 1*b* is a top view of the transition according to the invention having a slit perpendicular to the propagation direction of the microwaves.
Figure 1C:
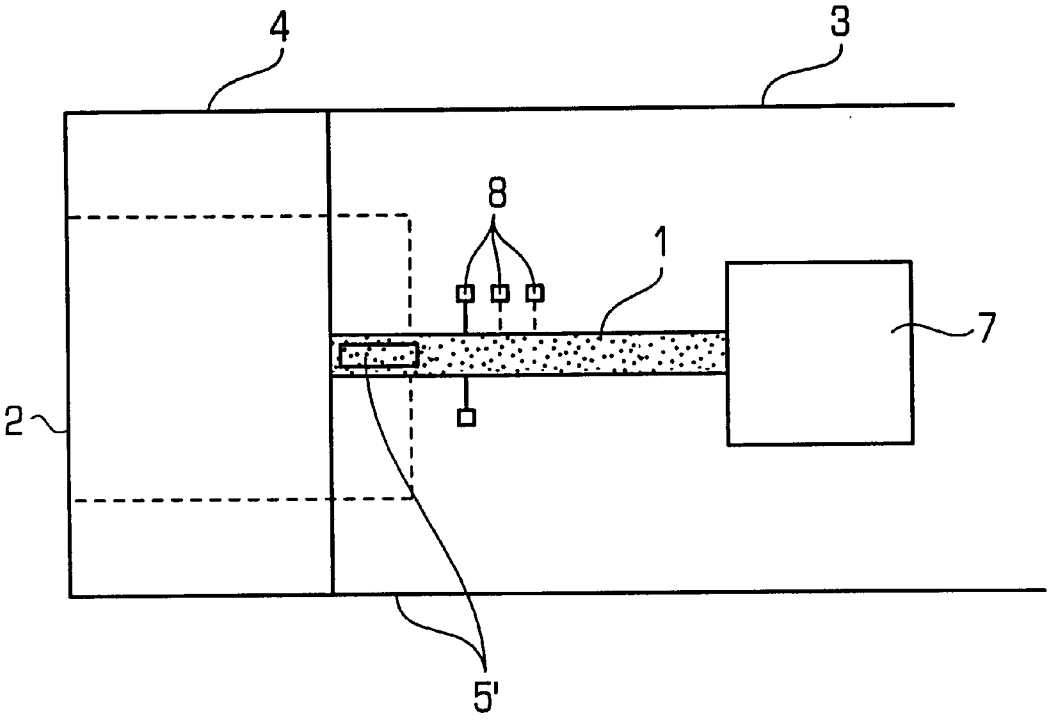
FIG. 1*c* is a top view of the transition according to the invention having a slit parallel the propagation direction of the microwaves.

On a ground surface, a microstrip line (1) is connected with a monolithic integrated microwave circuit arrangement (7). The microstrip line (1) is deposited on a dielectric, which in turn has been deposited on a ground surface (3). A metal block (6) is provided with a hollow space (2), for example, milled into the block, which is sealed toward a waveguide by a cover (4) and by the ground surface (3). A slit-shaped aperture (5,5') is made in the ground surface (3).

Using substrate plates with very thick metallic claddings on their backs makes it possible to form the cutout (2) directly in the plate. In this case, the upper wall is also formed by a cover (4). The electromagnetic fields propagating in the microstrip line (1) are coupled into the hollow space (2) via the slit-shaped aperture (5,5') made in the metallic cladding of the ground surface (3), which can be a substrate.

The width and position of the slit in relation to the end of the waveguide or the microstrip line (1) is to be selected to achieve the best possible transition.

The best possible transition depends on whether the microstrip line has an open end or is short-circuited. The transition in case of an open end is effected by $\lambda/2$ adjustment, in case of a short circuit of the microstrip line by $\lambda/4$ adjustment of the microwave which propagates in the microchip line.

Any remaining maladjustment may be reduced, for example, by adding different conductor elements to the microstrip line and/or taking measures in the waveguide. For example, tuning tabs (8) may be bonded to the microstrip line (1) via wires for adjustment. These tabs and wires may be already provided during production and connected with the microstrip line (1) during fine-tuning of the component.

Figure 2A:
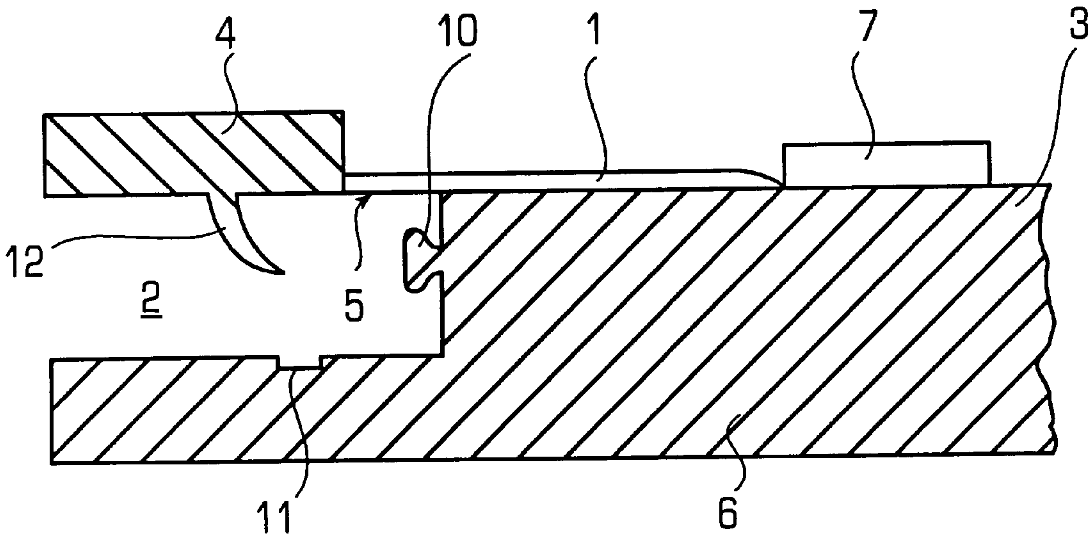
FIG. 2*a* is a cross section of the transition according to the invention having a knob, a groove, and a spur.
Figure 2B:
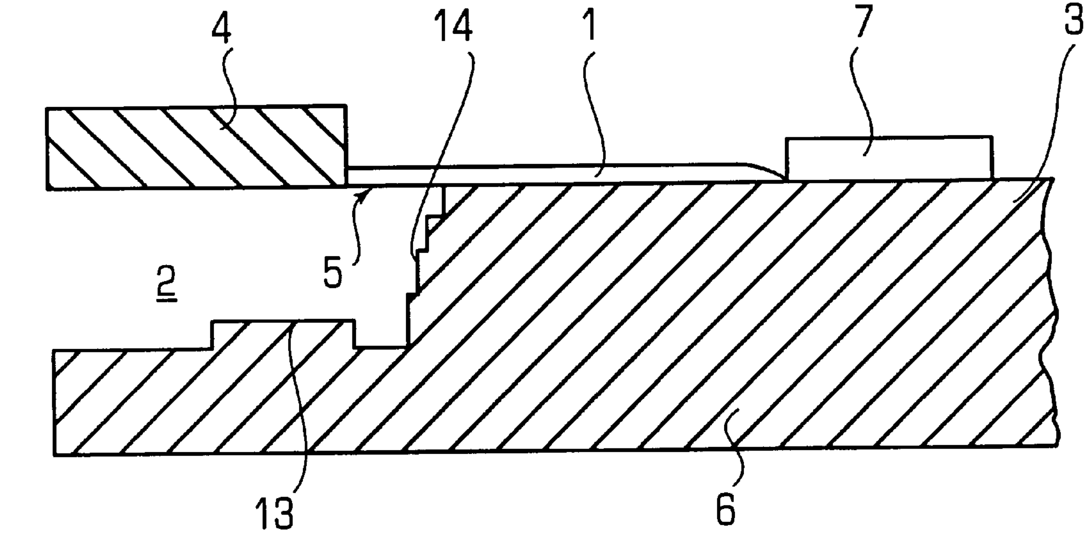
FIG. 2*b* is a cross section of the transition according to the invention having a platform and steps.

For tuning the transition, the waveguide, which is made, for example, from injection molded aluminum, may also be given a special form. Suitable are, for example, knobs 10, grooves 11, spurs 12, and similar geometric forms in the walls, as shown in FIG. 2*a*. Platforms 13 or steps 4, as shown in FIG. 2*b*, may be left in place to create optimum conditions for adjustment. Furthermore, adjustment rods for tuning may be provided in the hollow space. The transition may be effected via the E-field or the H-field or by a combination of the two.

The microwave printed circuit board (7) and the metal block (6) may be connected, for example, by a conductive adhesive.

Figure 3:
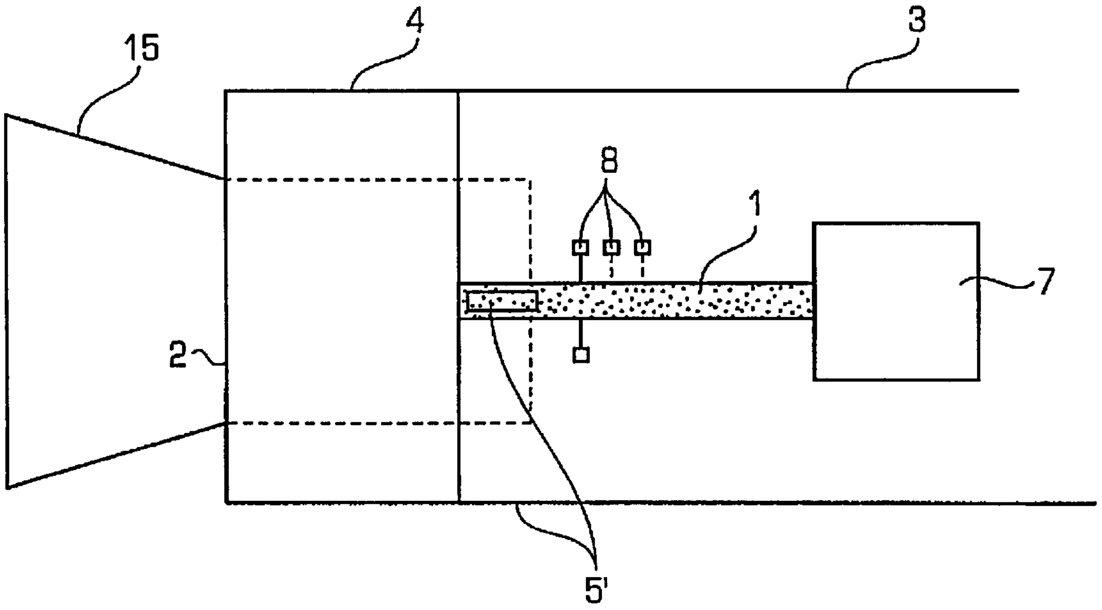
FIG. 3 is a top view of the transition according to the invention having a horn antenna.

The transition element according to the invention may be used, for example, in the area of subscriber lines if signals in the extremely high frequency range are received or emitted. The component is used at a base station for a distribution network and at the subscriber and is a cost-effective means for rerouting the signals of an amplifier, which may be integrated, for example, in component 7, to a waveguide and subsequently to an antenna. The use of a horn antenna 15, as shown in FIG. 3, is particularly advantageous for this application. With such a small, robust component, the last step of rerouting signals of a base station within a cell of up to one thousand households, for example, is made possible. Rerouting to a waveguide permits the use of economically attractive antennas. The combination of tuning elements in the hollow space (2) as well as on the microstrip line (1) allows for good adjustment of the component to the desired bandwidth and frequency of the signal. The simple structure of the component and its monolithic design make it robust and easy to produce and tune by machine.

What is claimed is:

1. A transition for coupling microwaves, comprising:

a microstrip line;

a ground surface having a slit aperture;

a metallic body having a cutout; and a cover, wherein a waveguide to guide the microwaves is formed by the cutout in the metallic body and the cover, and wherein the ground surface forms at least a part of a wall of the waveguide.

2. A transition according to claim 1, wherein the ground surface is a substrate plate, and the metallic body is a metallic cladding of a back of the substrate plate.

3. A transition according to claim 1, wherein the slit aperture is formed by a slit perpendicular to the propagation direction of the microwaves in the waveguide.

4. A transition according to claim 1, further comprising means provided in the waveguide to tune the microwaves.

5. A transition according to claim 1, further comprising geometric wall formations that are introduced in the waveguide.

6. A transition according to claim 5, wherein the geometric wall formations are selected from the group consisting of knobs, grooves, spurs, platforms and steps.

7. A transition according to claim 1, further comprising special means added to the microstrip line to tune the microwaves.

8. A transition according to claim 1, further comprising conductor segments connected to the microstrip line to tune the microwaves.

9. A transition according to claim 1, wherein the slit aperture is formed by a slit parallel to the propagation direction of the microwaves in the waveguide.

10. An antenna for transmitting high frequency signals on a TV distribution network, comprising a transition, said transition comprising:

a microstrip line;

a ground surface having a slit aperture;

a metallic body having a cutout; and a cover, wherein a waveguide to guide the microwaves is formed by the cutout in the metallic body and the cover, and wherein the ground surface forms at least a part of a wall of the waveguide.

11. A transition of claim 10, wherein the antenna is a horn antenna.

* * * * *